United States Patent [19]

Philipossian

[11] Patent Number: 4,950,156
[45] Date of Patent: Aug. 21, 1990

[54] INERT GAS CURTAIN FOR A THERMAL PROCESSING FURNACE

[75] Inventor: Ara Philipossian, Stoneham, Mass.

[73] Assignee: Digital Equipment Corporation, Maynard, Mass.

[21] Appl. No.: 372,669

[22] Filed: Jun. 28, 1989

[51] Int. Cl.[5] .......................... F27D 7/00; F27B 17/00
[52] U.S. Cl. .................................... 432/253; 118/715; 118/725; 432/11
[58] Field of Search ................. 432/5, 6, 11, 152, 253, 432/72, 2, 99; 118/715, 725; 156/345

[56] References Cited

U.S. PATENT DOCUMENTS

| | | | |
|---|---|---|---|
| 4,037,830 | 7/1977 | Poluzzi et al. | 269/21 |
| 4,484,538 | 11/1984 | Sarkozy et al. | 432/253 |
| 4,529,474 | 7/1985 | Fujiyama et al. | 118/715 X |
| 4,543,059 | 9/1985 | Whang et al. | 432/11 |
| 4,653,428 | 3/1987 | Wilson et al. | 118/725 |
| 4,803,948 | 2/1989 | Nakagawa et al. | 118/725 |

FOREIGN PATENT DOCUMENTS

| | | | |
|---|---|---|---|
| 0017614 | 2/1983 | Japan | 118/715 |
| 0062112 | 4/1985 | Japan | 118/715 |
| 0211914 | 9/1987 | Japan | 118/715 |
| 0239938 | 10/1988 | Japan | 118/715 |

Primary Examiner—Henry A. Bennet
Assistant Examiner—C. Kilner
Attorney, Agent, or Firm—Arnold, White & Durkee

[57] ABSTRACT

A tube furnace used for high-temperature processing of semiconductor wafers employs an annular manifold around the opening of the furnace tube where the wafer boats enter and exit, and this manifold or collar has a number of gas outlets to produce a radially-inwardly directed curtain of inert gas, such as nitrogen, to provide a physical barrier to prevent ambient gas from entering the furnace tube when the tubular cantilever is removed for loading and unloading operations. The manifold may be of unitary construction or may be constructed in two half-cylindrical parts, with separate gas inlets for each, so that the manifold may be removed to allow cleaning or replacement of the furnace tube. A symmetrical scavenger box surrounds this end of the furnace tube, outward of the annular manifold, so the inert gas introduced by the manifold and any ambient gas are scavenged in a radially symmetric manner.

17 Claims, 2 Drawing Sheets

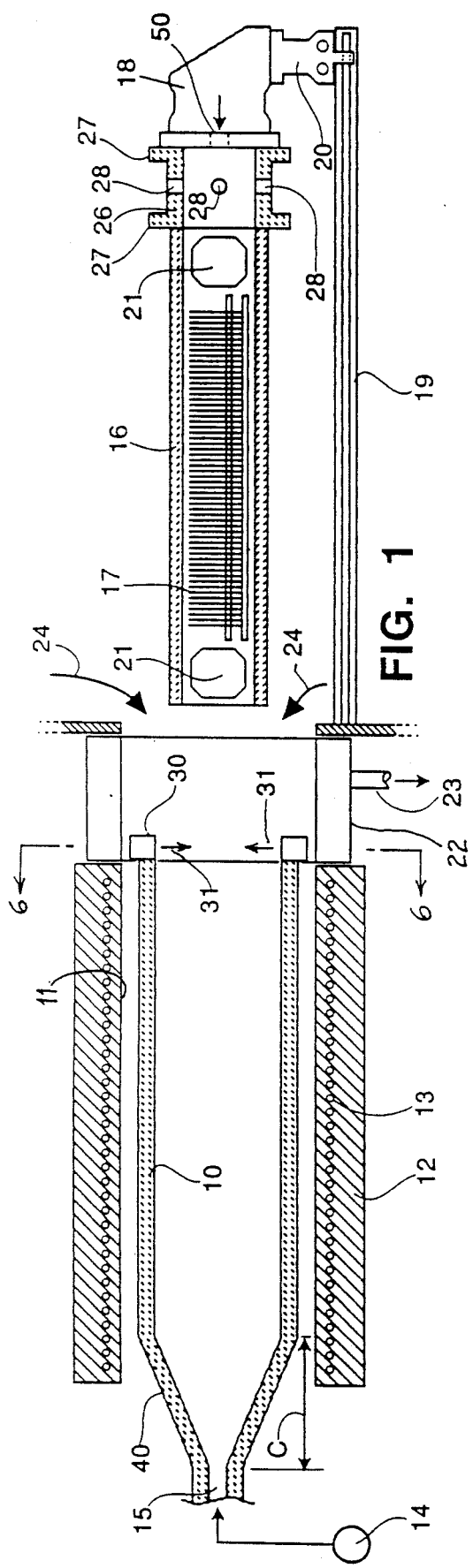
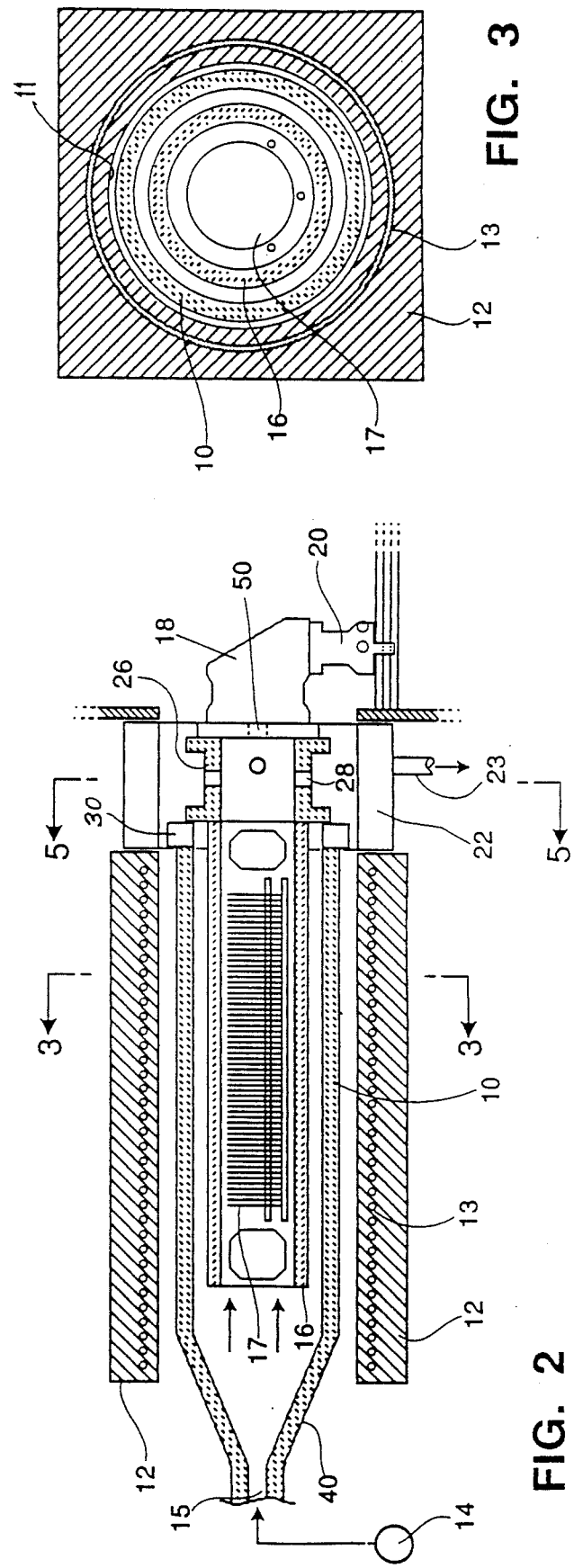

INERT GAS CURTAIN FOR A THERMAL PROCESSING FURNACE

RELATED CASES

This application discloses subject matter also disclosed in my copending patent application Ser. Nos. 372,672 and 372,663, filed concurrently herewith, assigned to Digital Equipment Corporation, assignee of this invention.

BACKGROUND OF THE INVENTION

This invention relates to semiconductor processing equipment, and more particularly to apparatus for performing high-temperature processes upon semiconductor wafers in a tube furnace.

Various types of thermal processing equipment are available commercially. During a process cycle, several boats containing silicon or other kind of wafers, supported by some kind of rod, are inserted into the furnace where the desired process is performed. Upon completion of the process cycle, the wafers are removed from the furnace and unloaded from the supporting rod. During the insertion and removal steps of the process, it is preferred that the wafers be protected from exposure to ambient air. Oxygen, water vapor and airborne particulates found in ambient air can react with the wafers and adversely affect their chemical and physical properties. One very convenient apparatus to do this has been described in U.S. Pat. Nos. 4,459,104 to Wollman and 4,543,059 to Whang et al, which describe a tubular cantilever into which the loaded wafer boats are inserted. By means of the tube, the wafers are protected against particulates, and, by flowing an inert gas through the tube, also protected from moisture and air. This is particularly important during the cantilever insertion and removal steps of a typical thermal process cycle. The tubular cantilever also reduces the amount of contaminants seen by the wafers inside the furnace tube itself since the wafer is isolated by the tubular cantilever from the furnace tube.

Further, it is important that the reaction or other processing step being performed on the wafers be carried out uniformly on all the wafers being processed, and uniformly across the surface of each wafer. Various furnace design changes have been made to assure a uniform flow of the reaction gases through the furnace tube to prevent contaminants from entering the reaction tube and adversely affecting the wafers, and to ensure efficient removal of the gases fed to the furnace.

Previously, the problems caused by ambient air infiltration in furnaces of this type have been addressed either by using high purging gas rates through the furnace tube from the nozzle at the opposite end, to create a positive pressure inside the furnace, or by using high scavenger exhaust rates to create a partial vacuum inside the scavenger area and thus to reduce air infiltration by diverting it into the scavenger exhaust. The scavengers are usually asymmetrical (i.e., located on one side of the furnace tube), so with high flow rates of purge gas through the reactor nozzle the exiting gas flow is also asymmetrical and can allow ambient air to enter due to the pressure gradients introduced by these asymmetries.

SUMMARY OF THE INVENTION

In accordance with one embodiment of the invention, a tube furnace used for high-temperature processing of semiconductor wafers employs an annular manifold around the opening of the furnace tube where the wafer boats enter and exit, and this manifold or collar has a number of gas outlets to produce a symmetrical, radially-inwardly directed curtain of inert gas, such as nitrogen, to provide a physical barrier that prevents ambient gas from entering the furnace tube when the wafer boats are removed for loading and unloading operations. A scavenger box surrounds this end of the furnace tube, outward of the annular manifold, so the inert gas and any ambient gas that gets through the barrier are scavenged before reaching the hot furnace tube; this scavenger box is itself constructed to provide symmetrical gas flow according to my copending application Ser. No. 372,663, filed concurrently herewith. When the wafer boats are in place within the furnace tube the annular manifold is not operating, and the scavenger box draws spent reactant gases outward from the furnace tube by a pressure differential. However, when the wafer boats are outside the furnace tube, the manifold barrier is operating, and also inert gas is admitted to the opposite end of the furnace tube, so the furnace tube is maintained in a non-contaminated state.

The manifold may be of unitary construction or constructed in two half-cylindrical parts, with separate gas inlets for each, so that the manifold may be removed to allow cleaning or replacement of the furnace tube.

Use of this symmetrical annular inert gas curtain can aid in producing wafers having improved uniformity in thickness and in the electrical and chemical qualities of gate oxides grown in a thermal processing furnace, because the infiltration of ambient air into the reaction chamber is greatly reduced. Improved process control, higher yields and larger throughputs are thus possible.

BRIEF DESCRIPTION OF THE DRAWINGS

The novel features believed characteristic of the invention are set forth in the appended claims. The invention itself, however, as well as other features and advantages thereof, will be best understood by reference to a detailed description of a specific embodiment, i.e., a tubular cantilever system, which follows, when read in conjunction with the accompanying drawings, wherein:

FIG. 1 is an elevation view in section of an atmospheric thermal processing furnace having a tubular cantilever in which features of the invention may be implemented, the furnace in this view being in a condition where the tubular cantilever is outside the furnace;

FIG. 2 is an elevation view in section of the furnace of FIG. 1, the furnace in this view being in a condition where the tubular cantilever is inside the furnace;

FIG. 3 is an elevation view in section of the apparatus of FIG. 2, taken along the line 3—3 in FIG. 2;

DETAILED DESCRIPTION OF SPECIFIC EMBODIMENT

Figure 4:
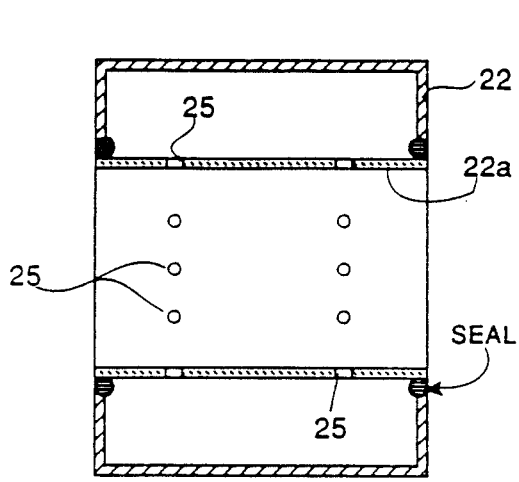
FIG. 4 is a perspective view of the scavenger box of FIGS. 1 and 2.

Although the following description and the Drawing refer specifically to one embodiment of a furnace of the invention having a tubular cantilever for carrying the wafers, the inert gas curtain of the invention can be used with any other thermal processing furnace, as will be known to one skilled in the art.

Referring to FIGS. 1, 2 and 3, a furnace for processing semiconductor wafers is illustrated according to features of one embodiment of the invention. This assembly includes an elongated cylindrical quartz furnace tube 10 located inside a cylindrical opening 11 of a diffusion furnace 12. The diffusion furnace 12 includes heater elements 13 of the resistance type functioning to raise the temperature within the furnace to an elevated level of perhaps 800° C. to about 1150° C. for performing some step of a semiconductor manufacturing process, such as diffusion, LPCVD (low pressure chemical vapor deposition), oxide growth, annealing, or the like. A source 14 of reactant or inert gas is connected to an inlet 15 at one end of the tube 10 to provide the desired atmosphere within the tube at various times in the operating cycle. Since the apparatus in one embodiment is intended to accommodate 6-inch diameter silicon wafers, the furnace tube 10 has a diameter of about 10-inch, although the particular size is selected according to the intended use of the system. A quartz tubular cantilever 16 holds a large number of these silicon wafers 17, and this tube is moved to a position out of the furnace as seen in FIG. 1 for loading or unloading the wafers or to a position within the furnace as seen in FIG. 2 for performing the high-temperature furnace operation; this position of FIG. 2 is also used for idling the furnace system for extended times, in which case there are no wafers 17 in place. The tubular cantilever 16 is supported at its outward end by a fixture 18 mounted on a track 19 by a slidable dolly 20. Construction of the tubular cantilever and track mechanism is disclosed in the above-mentioned U.S. Pat. Nos. 4,459,104 and 4,543,059.

While the tubular cantilever 16 is within the furnace as seen in FIG. 2, gas flow from the inlet 15 moves in the left-to-right direction indicated by arrows through the tube 16 to provide the desired atmosphere for the reaction or deposition intended. The composition of this gas is selected by the gas source 14 in accordance with the usual practice. Baffles 21 are positioned in the tubular cantilever 16 on both sides of the wafers 17 to retard loss of heat and to ensure adequate reactant mixing, but yet to allow free flow of reactant gases. Although a particular embodiment is shown in the Drawing, many other baffle arrangements are known and can be substituted by one skilled in the art. The spent or exhaust gases are collected in a scavenger box 22, for which an outlet 23 is maintained at below ambient pressure so that effluent reactant gases will be drawn into the scavenger box 22 rather than leaking out into the ambient outside the furnace. When the tubular cantilever 16 is in the outmost position, as seen in FIG. 1, the face of the furnace is open and ambient air or gas can enter the tube furnace as indicated by arrows 24; the scavenger box functions also to draw this ambient air or gas into the scavenger box 22 for exhaust by the outlet 23 rather than allowing it to reach the furnace tube 10. This is undesirable because ambient air, aside from being reactive, contains high levels of particulates and other contaminants. Air should be prevented from entering the furnace tube at all times.

As explained in my copending application Ser. No. 372,663, filed concurrently herewith, it is important that radial symmetry be provided for the gas flow into the scavenger box 22 from the furnace tube 10 or from the interior of the tubular cantilever 16. To this end, as illustrated in the detail view of FIG. 4, the openings for the flow of gas are a symmetrical array of openings 25 arranged in two cylindrical rings or bands, with the bands spaced apart by about a 4-inch distance. In one embodiment, there are sixteen of these openings 25, arrayed in two bands of eight each. The number and size of openings, their spacing, etc., are dependent upon the particular size of the furnace, gas flow rates, and the like. The openings 25 are formed in a cylindrical quartz inner liner 22a of the scavenger box 22; the fact that this section is made of quartz reduces contamination considerably, since a stainless steel tube would be susceptible to corrosion due to exiting chlorine-containing chemicals and thus would cause a contamination concern. The ends of the scavenger box 22 must be sealed so as to be airtight to prevent gases from exiting the scavenger box 22 from any channel other than the openings 25.

Figure 5:
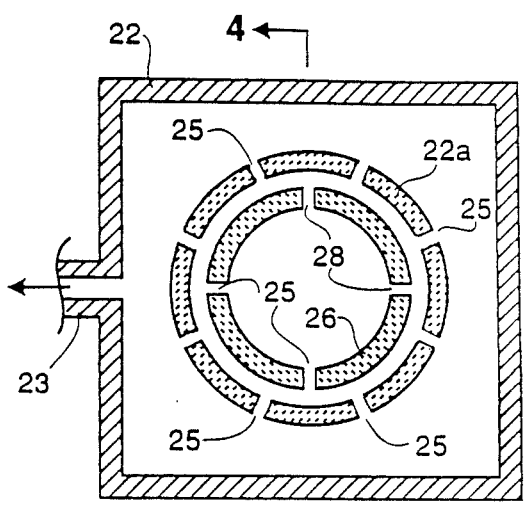
FIG. 5 is an elevation view in section of the scavenger box seen in FIGS. 1, 2 and 4, taken along the line 5—5 in FIG. 2.

Referring again to FIG. 1, at the outer end of the tubular cantilever 16 is a cylindrical quartz section 26 having a pair of flanges 27, serving as an extension of the tubular cantilever 16, and this section has a number of symmetrically-disposed openings 28, also seen in the section view of FIG. 5, which provide radially-symmetrical flow of exhaust gases, acting together with the two rows of openings 25 of the scavenger box 22. In the example embodiment four of these openings 28 are provided, although their particular number, size and configuration, i.e., the number of bands or rings, are dependent upon the factors mentioned above. When the tubular cantilever 16 is inside the furnace 12 as seen in FIGS. 2 or 5, the openings 28 in the end-section 26 are axially positioned about half-way between the positions of the openings 25 in the scavenger box 22.

Figure 6:
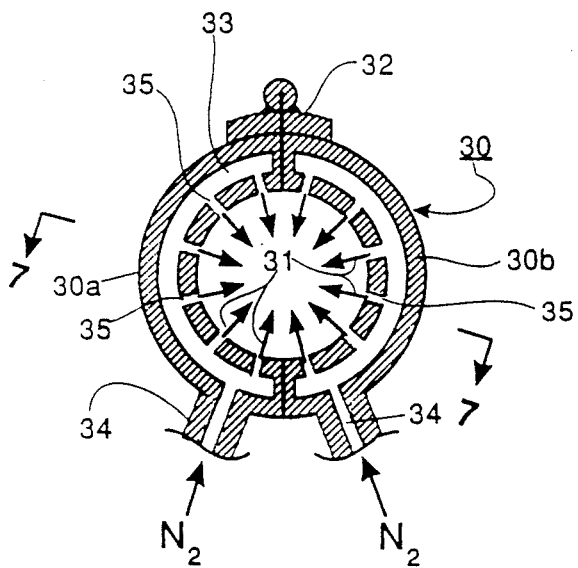
FIG. 6 is an elevation view in section of the annular collar-shaped manifold 30 seen in FIGS. 1 and 2, taken along the line 6—6 in FIG. 1, according to one embodiment of the invention.
Figure 7:
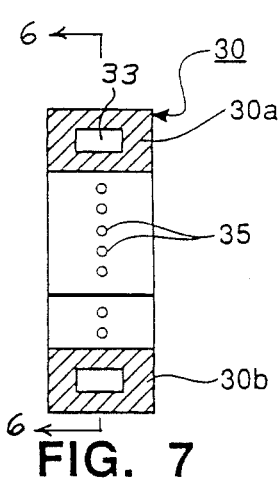
FIG. 7 is an elevation view in section of the collar 30 seen in FIGS. 1, 2 and 6, taken along the line 7—7 in FIG. 6.

According to a primary feature of the invention, a symmetrical manifold collar 30 surrounds the end of the furnace tube 10 and provides symmetrical injection of inert gas such as nitrogen gas, as indicated by the arrows 31. This injection only occurs when the tubular cantilever 16 is in the outermost position as seen in FIG. 1, or is being moved to or from the position of FIG. 2. According to one embodiment, as seen in FIG. 6, the collar 30 is split into two sections, 30a and 30b, which are rotatable about a hinge-like connection 32, i.e., the two halves 30a and 30b may be opened up to facilitate installation and removal, since the collar 30 must be removed from the furnace tube 10 for cleaning. The collar halves 30a and 30b each consist of a stainless steel, hollow, half-cylindrical section having an inner chamber 33 into which an inert gas is forced from an inlet 34, and having a number of nozzles or holes 35 producing the inwardly-projecting nitrogen curtain as indicated by the arrows 31. The collar halves 30a and 30b can also be made of other materials, such as silicon, silicon carbide, or quartz. The collar can also be of unitary construction with two points for injection of the inert gases. The volume of gas needed to provide the desired inert gas curtain depends upon the various dimensions of the furnace in a particular application, but in the example embodiment is a few hundred liters/minute flowing into the two inlets 34. The inert gas, e.g., nitrogen, exiting from the openings 35 forms a barrier or curtain, which is drawn out by the scavenger box 22 through the two sets of openings 25. Inert gas is also being forced through the furnace tube 10 at this time from the inlet 15, so the interior of the tube 10 is at a higher pressure than the ambient and the interior of the scavenger box 22; these pressure differentials along with the curtain effect are such that ambient air entering as indicated by arrows 24 will not reach the interior of the furnace tube 10 but instead will be harmlessly drawn out by the scavenger box 22.

Figure 8:
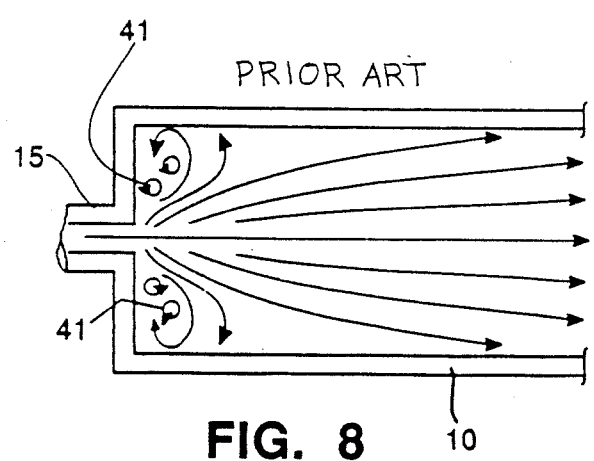
FIG. 8 is an elevation view in section of a gas inlet nozzle for a tube furnace according to the prior art.

According to the invention disclosed in my copending application Ser. No. 372,672, filed concurrently herewith, the shape of the inlet end of the quartz furnace tube 10, between the gas inlet 15 and the cylindrical body of the tube where the wafers will reside, defines a cone-like shape 40. This shape suppresses the formation of re-circulating gas cells 41 near the point of injection which form when the inlet 15 admits directly to a cylindrical tube as seen in FIG. 8. That is, the flow of gas passing the sharp corners of the inlet of FIG. 8 results in circular gas cells 41, making it harder to purge the tube when changing from one gas flow to another. The abrupt change in velocity of the incoming gas is illustrated by comparing the cross-sectional area $A_1$ of the inlet 15 to the area $A_2$ of the furnace tube 10; the gas flow obeys the relationship $A_1*V_1=A_2*V_2$ so that if the area $A_2$ is one hundred times that of $A_1$ then the velocity within the inlet 15 will be one hundred times that in the furnace tube 10. This abrupt change in velocity, as well as physical shape and change in volume due to the pressure differential, results in the formation of re-circulating gas cells 41. Also, in going from a pre-oxidation interval to an oxidation step, or in going from an oxidation interval to a post-oxidation step, when the furnace is being used for oxidizing the wafers 17, the improved purging capability of the conical section 40 will reduce the time of process gas overlaps. As has been determined by the prior work of others, the optimum shape for suppressing re-circulation cells of entering reactant gases is obtained by increasing the curvature of he sidewalls of the nozzle in the direction of theoretical flow streamlines.

The conical-like shape 40 in a preferred embodiment extends an axial length "c" as seen in FIG. 1; the length "c" is at least about a length which exceeds the diameter of the tube 10. Particularly, in one embodiment, the length "c" is about 12-inches when the diameter of the tube furnace is 10-inches. The conical-like shape 40 can be obtained by shaping the quartz tube 10 itself to the desired configuration as seen in FIG. 1, or alternatively as seen in FIG. 9 the furnace tube 10 can be cylindrical with a flat end 44, and filler material 45 of quartz or other material added to create the conical-like shape needed for optimum gas flow.

Figure 9:
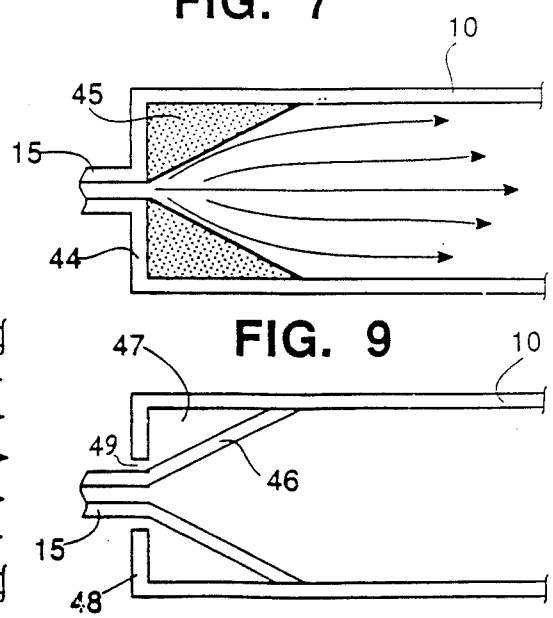
FIGS. 9 and 10 are elevation views in section of a gas inlet nozzle for a tube furnace according to alternative methods of construction.

It is preferable to maintain the outer cylindrical-like geometry of the quartz furnace tube 10 as illustrated in FIG. 9, rather than having a conical shape as seen in FIG. 1, because, from a mechanical standpoint, the cylindrical shape is less susceptible to breakage. Also, from a thermal standpoint, it is common practice to pack the nozzle end of furnace tubes with an insulating material to minimize heat losses from the rear of the furnace. Packing cylindrical-shaped tubes with insulating materials is much easier and more thermally efficient. Furthermore, since most furnaces are constructed for using cylindrical-shaped furnace tubes, the shape of FIG. 9 is more consistent with current furnace hardware, compared to that of FIG. 1.

Figure 10:
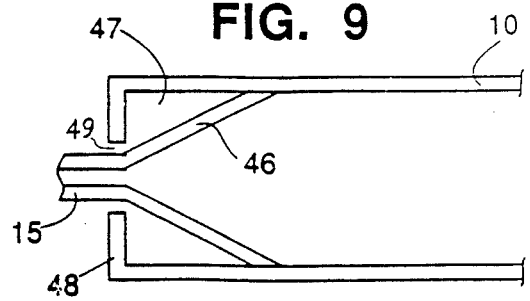

Manufacturing the nozzle shown in FIG. 9 may be fairly labor intensive and will require a large amount of quartz material as the filler 45 to be able to effectively fill the space inside the tube and make it conical. Furthermore, such a tube would have a large mass and may act as a source of heat dissipation, or at least create thermal inertia. An alternative construction of the conical nozzle of the furnace tube is shown in FIG. 10, where the tube 10 is of cylindrical shape all the way to the end, but has a conical insert 46 to create a same inner conical geometry as FIGS. 1 or 9, to which the inlet 15 is integrally formed, but leaving a hollow interior annular chamber 47. This construction is much lighter since it does not need the filler 45, is easier to construct, and does not have the heat dissipation or inertia that the embodiment of FIG. 9 would have. It is preferable that the end piece 48 of the cylindrical tube 10 does not join with the inlet 15 but instead leaves an annular opening 49 so the chamber 47 is not sealed; if the chamber 47 were sealed then the gases inside the chamber would expand and crack the tube 10, and also the opening 49 is large enough to allow cleaning liquids to drain out when the furnace tube 10 has been removed and is being cleaned in a conventional tube etcher. If the opening 49 is not left, i.e., the end piece 48 extends all the way to the inlet 15, sealing the chamber 47, then the chamber must be evacuated during construction to leave a vacuum.

A typical operating sequence for the tube furnace described above with reference to FIGS. 1 and 2 is set forth in the following Table A. There are three gas sources in this apparatus; first, inert or reactant gas is introduced at the inlet 15 to the furnace tube 10 from the source 14; second, inert gas is introduced at an inlet 50 at the outer end of the tubular cantilever 16 to keep ambient gas from entering the tubular cantilever which can contaminate the wafers during loading, idle or cool-down phases of operation (of course, as mentioned above, if the separate tubular cantilever 16 is not used, then the gas inlet 50 is omitted); and, third, the curtain of inert gas is introduced at the collar 30 through inlets 34. Assuming that the idling condition of the furnace is when the tubular cantilever is inside the furnace, as shown in FIG. 2, and that nitrogen ($N_2$) is flowing through the inlet 15 of the furnace tube 10, the sequence of applying the three gases from the three sources is seen in Table A where the operational terms refer to movement of the tubular cantilever 16:

TABLE A

| Step | Time (Min.) | Tube $N_2$ | Curtain $N_2$ | Tubular Cantilever $N_2$ | Operation |
| --- | --- | --- | --- | --- | --- |
| 0 | — | Yes | No | No | Idle |
| 1 | 20 | Yes | Yes | Yes | Unload (Pullout) |

(load product wafers 17 into boats and insert boats into tubular cantilever at this time)

| | | | | | |
| --- | --- | --- | --- | --- | --- |
| 2 | 20 | Yes | Yes | Yes | Purge |
| 3 | 20 | Yes | Yes | Yes | Load (Push-in) |
| 4 | 30 | Yes | No | No | Temp Ramp-Up |
| 5 | 10 | No (Ox.) | No | No | Oxidation |
| 6 | 30 | Yes | No | No | Anneal |
| 7 | 40 | Yes | No | No | Temp Ramp-Down |
| 8 | 20 | Yes | Yes | Yes | Unload (Pull-out) |

(remove product wafers 17 from tubular cantilever 16 at this time)

| | | | | | |
| --- | --- | --- | --- | --- | --- |
| 9 | 20 | Yes | Yes | Yes | Load (Push-in) |

TABLE A-continued

| Step | Time (Min.) | Tube N₂ | Curtain N₂ | Tubular Cantilever N₂ | Operation |
|---|---|---|---|---|---|
| 10 | — | Yes | No | No | Idle |

While this invention has been described with reference to a specific embodiment, this description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A thermal processing furnace comprising:
   (a) a tube furnace having an elongated cylindrical chamber open at one end for receiving articles to be processed;
   (b) means for introducing reactant or inert gasses into the other end of said cylindrical chamber; and
   (c) means for providing an inert gas barrier surrounding said one end of said cylindrical chamber, said means including a removable annular manifold having at least two sections and having a plurality of openings in each of said sections spaced circumferentially around an inner face of said sections of said manifold to direct inert gas radially inwardly of said cylindrical chamber to prevent ambient gas from entering said cylindrical chamber.

2. Apparatus according to claim 1 wherein said plurality of openings in said manifold include at least about six openings substantially equally spaced about said inner face of said manifold.

3. A thermal processing furnace comprising:
   (a) a tube furnace having an elongated cylindrical chamber open at one end for receiving articles to be processed;
   (b) means for introducing reactant or inert gasses into the other end of said cylindrical chamber; and
   (c) means for providing an inert gas barrier surrounding said one end of said cylindrical chamber, including an annular manifold having a plurality of openings spaced circumferentially around an inner face of said manifold to direct inert gas radially inwardly of said cylindrical chamber to prevent ambient gas from entering said cylindrical chamber, wherein said manifold includes two halves separately removable from said one end, and each of said halves has a separate source of said inert gas coupled thereto.

4. A furnace for performing high-temperature processes upon semiconductor wafers, comprising:
   (a) a tube furnace having an elongated cylindrical heated chamber open at one end for receiving semiconductor wafers;
   (b) a tubular cantilever for containing said semiconductor wafers, said tubular cantilever being supported at an outer end for axial movement into said chamber for performing said high temperature processes and out of said chamber for loading and unloading said semiconductor wafers;
   (c) means for introducing reactant or inert gasses into the other end of said cylindrical chamber; and
   (d) means for providing an inert gas barrier surrounding said one end of said cylindrical heated chamber, said means including a removable annular manifold having at least two separate separate sections and having a plurality of openings in each of said sections spaced circumferentially around an inner face of said manifold to direct inert gas radially inwardly during times when said tubular cantilever is out of said chamber, to prevent ambient gas from entering said cylindrical heated chamber.

5. Apparatus according to claim 4 wherein said annular manifold is split into two sections, and separate sources of inert gas are coupled to said two sections, said separate sources being activated only when said tubular cantilever is out of said cylindrical heated chamber, and are deactivated when said tubular cantilever is within said chamber.

6. Apparatus according to claim 4 wherein said tubular cantilever is a quartz tube, and wherein said elongated cylindrical heated chamber includes a quartz furnace tube of diameter larger than said tubular cantilever.

7. Apparatus according to claim 4 including a substantially symmetrical scavenger box located radially outward of said furnace tube and said manifold, said scavenger box being substantially cylindrical and having a plurality of gas outlet ports.

8. A method of operating a tube furnace of the type used for performing high-temperature processes upon semiconductor wafers, comprising the steps of:
   (a) loading a plurality of semiconductor wafers into one end of said tube furnace;
   (b) introducing reactant or inert gasses into the other end of said tube furnace; and
   (c) forming a barrier by jets of inert gas around said one end of the tube furnace, wherein said jets of inert gas are provided by a removable annular manifold at said one end of said tube furnace, said manifold having a plurality of openings positioned to surround said one end of said tube furnace, said openings being spaced circumferentially around an inner face of said manifold for providing radially symmetrical inflow of inert gas.

9. A method according to claim 8 wherein said inert gas is scavenged at a position surrounding said end of said tube furnace and said manifold.

10. A method according to claim 9 wherein said insert gas is scavenged in a symmetrical manner.

11. A method according to claim 10 wherein said insert gas is scavenged by providing a plurality of openings spaced circumferentially around said one end of the tube furnace.

12. A method of operating a tube furnace of the type used for performing high-temperature processes upon semiconductor wafers, comprising the steps of:
   (a) loading a plurality of semiconductor wafers into one end of said tube furnace;
   (b) introducing reactant or inert gasses into the other end of said tube furnace;
   (c) forming a barrier by jets of inert gas around said one end of the tube furnace, said jets of inert gas being provided by an annular manifold at said one end of said tube furnace, said manifold having a plurality of openings positioned to surround said one end of said tube furnace, said tube furnace being symmetrically scavenged at a position surrounding said end of said tube furnace and said manifold by a plurality of openings spaced circumferentially around said end of the tube furnace for exhaust of gases; and (d) introducing purging inert gas into the other end of said furnace tube.

13. Apparatus according to claim 12 wherein said manifold is in two half-circular pieces, each of which has a cylindrical inner wall and each of which has an outer wall radially outward of said inner wall.

14. An annular gas-jet manifold for use at an opening of a furnace tube or the like, said opening receiving a cantilever-type tube, comprising:
 (a) a cylindrical inner wall with a plurality of openings therein, said openings spaced circumferentially around said inner wall to provide radially symmetrical inflow of gasses;
 (b) an outer wall radially outward of said inner wall;
 (c) means for introducing said inflow of gasses under pressure into the space between said inner wall and said outer wall;
 (d) said manifold, including said inner wall, said outer wall, and said means for introducing, being in sections to be removable from said furnace tube.

15. Apparatus according to claim 14 wherein said openings are substantially equally spaced from one another about the opening of said furnace tube.

16. Apparatus according to claim 14 including a scavenger box positioned radially outward of and surrounding said manifold.

17. Apparatus according to claim 16 wherein said scavenger box includes a symmetrical plurality of exhaust ports circumferentially spaced about said scavenger box in a symmetrical manner.

* * * * *

UNITED STATES PATENT AND TRADEMARK OFFICE
CERTIFICATE OF CORRECTION

PATENT NO. : 4,950,156

DATED : August 21, 1990

INVENTOR(S) : Ara PHILIPOSSIAN

It is certified that error appears in the above-identified patent and that said Letters Patent is hereby corrected as shown below:

Column 5, line 44, change "he" to --the--.

Column 8, line 1, delete "separate" (second occurrence).

Column 8, line 3, after "said" insert --separate--.

Signed and Sealed this

Thirtieth Day of March, 1993

Attest:

STEPHEN G. KUNIN

*Attesting Officer*       *Acting Commissioner of Patents and Trademarks*